(12) United States Patent  
Davis et al.

(10) Patent No.: US 7,679,924 B2
(45) Date of Patent: Mar. 16, 2010

(54) CONFIGURABLE CHASSIS GUIDANCE SYSTEM AND METHOD

(75) Inventors: Simon John Davis, Stittsville (CA); Mark R. Megarity, Ottawa (CA); Joey M. W. Chow, Nepean (CA); Dion Pike, Stittsville (CA)

(73) Assignee: Alcatel Lucent, Paris (FR)

( * ) Notice: Subject to any disclaimer, the term of this patent is extended or adjusted under 35 U.S.C. 154(b) by 895 days.

(21) Appl. No.: 11/437,965

(22) Filed: May 19, 2006

(65) Prior Publication Data

US 2007/0086175 A1  Apr. 19, 2007

Related U.S. Application Data

(63) Continuation-in-part of application No. 11/253,081, filed on Oct. 17, 2005.

(60) Provisional application No. 60/779,906, filed on Mar. 6, 2006.

(51) Int. Cl.
 *H05K 7/14* (2006.01)
(52) U.S. Cl. .................. 361/756; 361/741; 361/802; 361/735
(58) Field of Classification Search ............ 361/735, 361/756, 741, 802
See application file for complete search history.

(56) References Cited

U.S. PATENT DOCUMENTS

| 4,998,180 A | | 3/1991 | McAuffle et al. |
| 5,078,530 A | * | 1/1992 | Kim .................. 403/24 |
| 5,492,478 A | | 2/1996 | White |
| 5,881,508 A | * | 3/1999 | Irvine et al. ............ 52/177 |
| 5,988,511 A | * | 11/1999 | Schmidt et al. ......... 235/492 |
| 6,368,011 B1 | * | 4/2002 | LaFountain et al. ..... 403/363 |
| 6,646,890 B1 | | 11/2003 | Byers et al. |

(Continued)

FOREIGN PATENT DOCUMENTS

| DE | 1490 515 | 7/1971 |
| EP | 0 425 183 A2 | 5/1991 |
| EP | 1 777 998 A2 | 4/2007 |

OTHER PUBLICATIONS

PICMG AMC.0 Advanced Mezzanine Card Short Form Specification, Jun. 15, 2004, Version D0.9a, PCI Industrial Computer Manufacturers Group.

*Primary Examiner*—Dameon E Levi
(74) *Attorney, Agent, or Firm*—Ross D. Snyder & Associates, Inc.

(57) ABSTRACT

A configurable chassis guidance system and method are described. The system may be practiced as a chassis and/or a module or an element thereof (e.g., a mating guide). The system and method allow reconfiguration of multiple modules of various module widths without the need for removal or reinstallation of module guides mounted on the chassis. As an example, a single-width module may be removed and replaced by a double-width module or quadruple-width module without removing module guides used to engage the single-width module. As another example, a double-width module or quadruple-width module may be removed and replaced by a single-width module without removing module guides used to engage the double-width module or quadruple-width module. The system and method may be practiced so as not to impair compatibility of modules with card edge module guides that engage an edge of a circuit board of a module.

20 Claims, 9 Drawing Sheets

U.S. PATENT DOCUMENTS 6,788,081 B2    9/2004  Brunelle et al.
6,839,238 B2 *  1/2005  Derr et al. .................. 361/735
7,499,282 B1 *  3/2009  Loucks ....................... 361/730
7,505,280 B1 *  3/2009  Loucks ....................... 361/752

* cited by examiner

CONFIGURABLE CHASSIS GUIDANCE SYSTEM AND METHOD

CROSS-REFERENCE TO RELATED APPLICATIONS

The present application is a continuation-in-part of application Ser. No. 11/253,081, filed Oct. 17, 2005. The present application claims priority under 35 U.S.C. §119(e) to the following United States provisional applications: Application. No. 60/779,906, filed Mar. 6, 2006.

BACKGROUND OF THE INVENTION (1) Field of the Invention

The present invention relates to electronic systems and more particularly to modular electronics systems having a chassis configurable for a variety of modules.

(2) Description of the Related Art

While some electronic systems are a manufactured in a fixed format that does not include or accept modules to allow flexibility in configuring the hardware elements of the system, many electronic systems are modular in nature and include chassis structures and connectors to accept modules. However, typical modular electronic systems impose constraints on modules, for example, requiring that all modules be of the same size, etc. It would be useful for a system to be able to accept modules of varying sizes, for example to accommodate modules supporting different numbers of communication channels.

In the prior art, U.S. Pat. No. 6,646,890, issued to Byers et al. (hereinafter Byers) describes mounting of mezzanine circuit boards to a base board. Byers describes guide rails that can be moved to provide a new spacing to accommodate a different width mezzanine board without having to take the supporting base board out of service. However, the guide rails of Byers suffer several disadvantages. While Byer describes guide rails to accommodate a plurality of nested mezzanine boards, it appears that the widths of the nested mezzanine boards are constrained by the guide rails such that nested mezzanine boards cannot be of different widths. Moreover, as the guide rails appear to be separate from the mezzanine circuit boards, the guide rails of Byers appear to have the potential for causing logistical complexities and delays if, for example, a guide rail is not available at the time a mezzanine circuit board is desired to be installed.

The utility, practicality, and convenience of a modular system would be enhanced if it were able to be configured (e.g., installed in an initial configuration or reconfigured) without the need for special parts and/or disturbance to modules not involved in the configuration. For example, two one-port modules were to be replaced by one two-port module, it would be desirable to avoid a need to install or remove special parts. Thus, a technique for configurably accommodating modules of various types (e.g., sizes) is needed.

BRIEF DESCRIPTION OF THE SEVERAL VIEWS OF THE DRAWINGS

The present invention may be better understood, and its features made apparent to those skilled in the art by referencing the accompanying drawings.

The use of the same reference symbols in different drawings indicates similar or identical items.

DETAILED DESCRIPTION OF THE INVENTION

Figure 1:
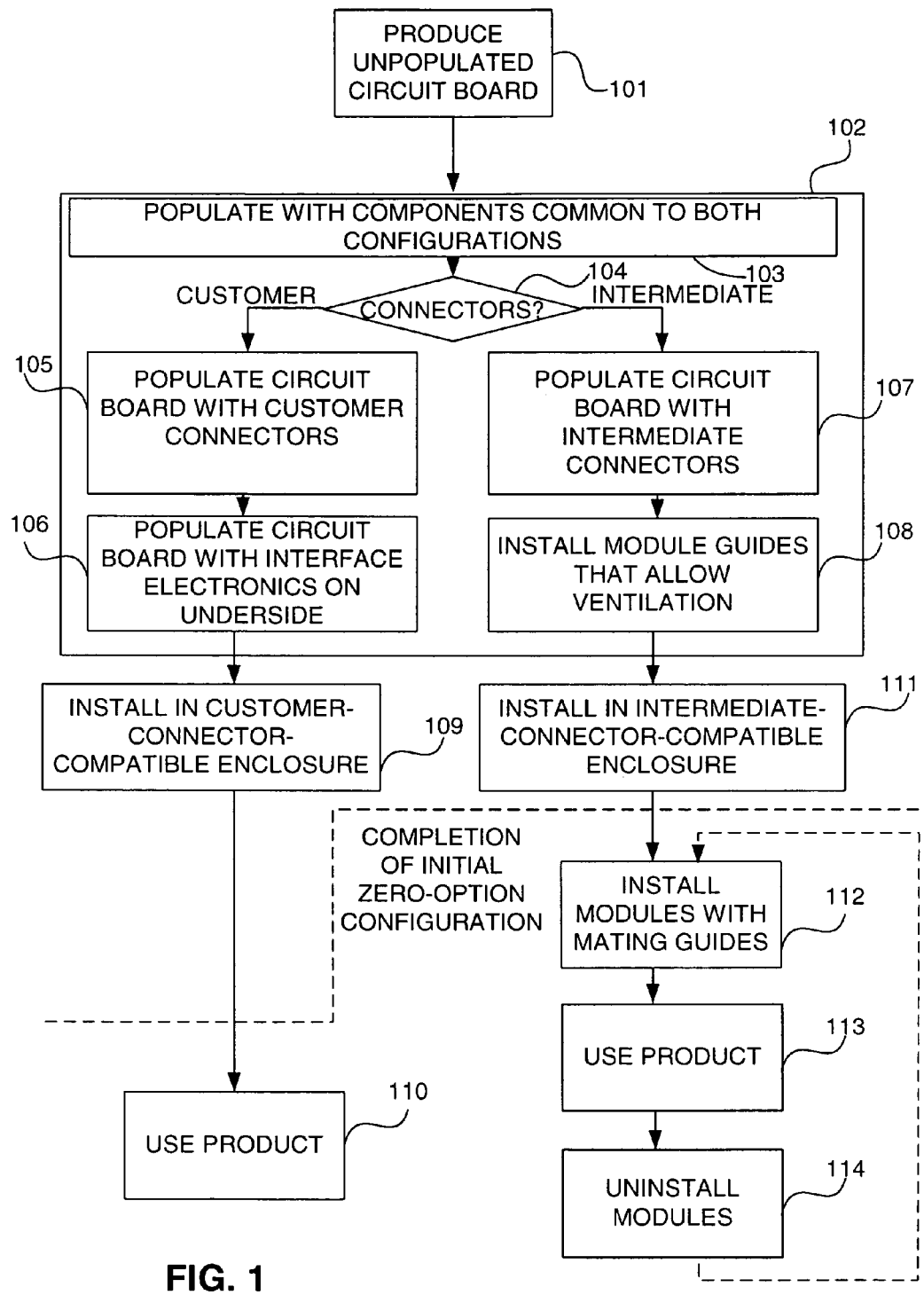
FIG. 1 is a flow diagram illustrating a method in accordance with at least one embodiment of the present invention.

A configurable chassis guidance system and method are described. The system may be practiced as a chassis and/or a module or an element thereof (e.g., a mating guide). The system and method allow reconfiguration of multiple modules of various module widths without the need for removal or reinstallation of module guides mounted on the chassis. As an example, a single-width module may be removed and replaced by a double-width module or quadruple-width module without removing module guides used to engage the single-width module. As another example, a double-width module or quadruple-width module may be removed and replaced by a single-width module without removing module guides used to engage the double-width module or quadruple-width module. The system and method may be practiced so as not to impair compatibility of modules with card edge module guides that engage an edge of a circuit board of a module.

In accordance with at least one embodiment, a guidance system for pluggable circuit boards that may be plugged into an electronics chassis is described. The system permits the installation of variable width boards in a common chassis slot without any modification to the chassis being required. One or more embodiments may be applied to electronic systems in the field of telecommunications and/or systems in other fields such as computing platforms, electronic test equipment, etc.

It is useful to be able to plug different types of modules (e.g., circuit cards comprising circuit boards) (for example, those providing different flavours of customer interfaces—such as T1, 10/100, optical, OC3, etc.) into a common slot in an electronics chassis (e.g., an electronics chassis housing horizontally oriented boards). The modules may be of variable widths. Accordingly, the guidance mechanism for insertion and/or removal of the modules should accommodate the variable widths while imposing few restrictions on the usable circuit board area of the cards. In addition, it is not desirable to require the end user to perform any field modifications to the chassis in order to insert any of the various width card options (e.g., no removal or addition of guidance parts should be necessary in order to permit installation of various widths of cards in the same slot). For example, if a card edge module guide were required to be removed for installation of a wider module and were required to be reinstalled for replacement of the wider module with a narrower module, the card edge module guide might be misplaced between the time of removal and reinstallation. If the card edge module guide were unavailable when it was to be reinstalled, a replacement would have to be procured, which could greatly complicate and delay the process, or, if a replacement were no longer available, the entire chassis might have to be replaced. Thus, in accordance with at least one embodiment, the need for reconfiguration of card edge module guides may be avoided.

However, at least one embodiment provides compatibility with other systems, such as those that involve removal and reinstallation of card edge module guides. For example, PICMG AMC.0 Advanced Mezzanine Card Short Form Specification, Version D0.9a (Draft), Jun. 15, 2004, covers various alternatives for mounting mezzanine cards onto a carrier (or base) printed circuit board (PCB). The specification covers guide rails and connector formats as well as special carrier adaptations such as cut-outs to accept stacked mezzanine cards. While components described in the specification suffer from the shortcomings described above, it may be desirable to implement at least one embodiment of the present invention so as not to be incompatible with such components. Accordingly, at least one embodiment may be practiced to provide a chassis that may be used to engage modules offering the benefits described herein and/or other mezzanine cards, such as PICMG AMC.0 mezzanine cards. As another example, at least one embodiment may be practiced to provide modules that may be used to engage a chassis offering the benefits described herein and/or other chassis, such as a PICMG AMC.0 chassis.

In accordance with at least one embodiment, an offset guide rail is provided on one side (e.g., the bottom side) of the card as the primary guidance mechanism for the card. This differs from traditional methods which use the card edge sliding in a card edge guide as the primary guidance mechanism. The offset guide rail elevates the card above the guidance mechanism in the chassis thus permitting great variability in the width of the cards which can plug into a given slot, as the cards simply slide above the chassis guiding mechanism during insertion. For cards that span an unused module guide, components on the side of the card facing the unused module guide (e.g., the bottom side) should, in the immediate area of the unused module guide, extend no farther in height away from the card surface than the height of the gap defined between the card surface and the unused module guide so as to prevent contact between the components and the unused module guide. When a chassis as described herein is used in conjunction with modules as described herein, no chassis modification is required in order to remove a module of a first width and install a module of another width in its place—i.e., the chassis slot is universal. In addition, in accordance with at least one embodiment, the offset guide rail (e.g., mating guide) and/or the module guide includes large cutouts to allow cooling air to flow on the bottom side of the card. Furthermore, if the surface of a circuit card upon which the offset guide rails are mounted are left free of components in the vicinity of side edges, then the circuit card can be implemented to be compatible with both the PICMG AMC specification and a guidance mechanism featuring the benefits of the present invention. Still further, a similar guidance mechanism to that mounted on the chassis (e.g., T-bars or halves of T-bars, which may, for example, be described as L bars or C bars) can be mounted on the top side of a card to accept the offset guide rails of another card, thereby enabling vertical stacking of cards in the system chassis.

At least one embodiment may be practiced so as to give a customer complete flexibility for the configuration of card types in a given chassis slot. A customer can populate/repopulate a chassis with a variety of combinations of card widths in a given slot without having to perform any modifications to the chassis to add or remove a guidance feature. For example, possible combinations in a given chassis slot having a total width sufficient to accommodate four single-width cards are as follow: 4× single width cards, 2× single width+1× double width, 2× double width, 1× single width+1× triple width, and 1× quadruple width. Not only are all of those combinations possible, but all possible permutations may be practiced. For example, two single-width cards may be situated to the left of one double-width card or to the right of one double-width card, or one single-width card may be situated to the left of one double-width card and another single-width card may be situation to the right of the double-width card.

In accordance with at least one embodiment, apparatus may comprise a system having a chassis comprising at least one module guide and at least one module comprising at least one mating guide to engage the at least one module guide. In accordance with at least one embodiment, apparatus may comprise a chassis comprising at least one module guide to engage at least one mating guide of at least one module. In accordance with at least one embodiment, apparatus may comprise at least one module comprising at least one mating guide to engage at least one module guide of a chassis. Embodiments may allow use of multiple-unit-wide modules (e.g., 2×, 3×, 4× wide modules) providing clearance to prevent components mounted on the modules from contacting at least one unused module guide on the chassis. Embodiments may utilize at least one additional module guide on a first module to engage at least one additional mating guide of a second module to permit stacking (e.g. vertical stacking) of cards in a chassis. Accordingly, several modules may be disposed next to each other (e.g., having their circuit boards in the same plane), while one or more other modules may be stacked with respect to those one or more of those several modules. Thus, a two-dimensional array of modules may be made accessible to a customer and the customer given an ability to replace any one or more of those modules without disturbing other modules. By providing unpopulated areas (i.e., areas unobstructed by electronic components or other objects) along edges of a circuit board of a module, the module can be made to be compatible with card edge module guides while also being compatible with module guides described herein that provide advantages over card edge module guides.

A method and apparatus for an electrical system architecture capable of providing fixed or modular components, for example, interface connectors, is provided. Fixed components allow product cost to be minimized. Modular components provide flexible configurability of products. In accordance with at least one embodiment of the present invention, an electrical system architecture capable of providing fixed or modular components minimizes costs such as design, production, and customer support costs while being able to provide a range of product variants.

As one example, at least one embodiment of the present invention may be used to provide a circuit board, such as a printed circuit board (PCB), that is designed for several interface ports, for example, 24 fixed 10-megabit-per-second/100-megabit-per-second (10 Mbps/100 Mbps or 10/100) ethernet interface ports, two fixed gigabit ethernet (GE) interface ports, or, alternatively, several (e.g., four) pluggable modules.

In accordance with at least one embodiment of the present invention, a single PCB, for example, one having dimensions of 15.45"×11.00", can be used to implement either a fixed or fully modular interface system. One example of a fixed interface system comprises three fixed 2×6 RJ45 connectors and two fixed GE small-form-pluggable (SFP) interface ports stuffed on the PCB. Additional metal work wraps around such a fixed PCB assembly to provide a low cost, physically small, and attractive product.

In the past, providing a modular version from such a product design would typically consist of a complete re-design of the PCB. However, in accordance with at least one embodiment of the present invention, by de-stuffing (or not stuffing) the port interface connectors (e.g., RJ45 and SFP connectors), adding modules guides, and wrapping the PCB in a different metal wrap, a fully modular product variant can be provided with a very short time to market.

In accordance with at least one embodiment of the present invention, features may be provided to facilitate use of a common circuit board for fixed and modular configurations and conversion between fixed and modular configurations. As one example, a removable card guide mechanism for the modules may be provided. As another example, a mounting technique may be used to maintain the vertical position of the common circuit board in such a way as to allow airflow over the modules and circuit board for both fixed and modular configurations. As another example, the common circuit board may be mounted upside down to keep mounting screws from interfering with module insertion.

In accordance with at least one embodiment of the present invention, a common circuit board design may be used for various I/O port configurations, including fixed and replaceable I/O ports, thereby reducing design costs. By allowing use of a common circuit board for multiple configurations, a faster time to market can be obtained for implementations having new I/O port configurations, e.g., if replaceable/modular I/O ports are required in a new product based on a product that featured a fixed interface.

FIG. 1 is a flow diagram illustrating a method in accordance with at least one embodiment of the present invention. In step 101, an unpopulated circuit board is produced. Circuit boards typically comprise a insulating substrate, for example, a flame retardant type 4 (FR4) glass-fiber/epoxy-resin composite substrate with one or more layers of conductive material, such as metal, for example, copper. Conductive layers may be provided on external surfaces of the substrate and/or internal to the substrate. Conductive material may be selectively removed from portions of the conductive layer or layers to form conductive patterns, which may be referred to as printed circuits. Thus, such circuit boards may be referred to as printed circuit boards (PCBs). Printed circuits provide conductive interconnects for components that may be mounted on PCBs, for example, passive components, such as resistors, capacitors, and/or inductors; active components, such as integrated circuits and/or transistors; and/or other components, such as connectors, switches, input devices, and/or output devices. After establishing printed circuits on a PCB, additional steps may be undertaken, for example, drilling holes in the PCB, applying (e.g., plating) conductive material to line at least one of the holes so as to conductively bridge portions of different conductive layers of the PCB, applying at least one solder mask layer over at least a portion of at least one surface of the PCB to protect conductive material and inhibit solder contact with protected areas, and/or applying (e.g, silk-screening) printed nomenclature to identify component locations. Any or all such steps may be performed to produce an unpopulated PCB, which is a PCB that has not yet been populated by components (i.e., to which components have not yet been added).

In step 102, the circuit board is populated with components. Step 102 may comprise steps 103, 104, 105, 106, 107, and/or 108. In step 103, the circuit board is populated with components common to circuit boards intended to be populated with customer connectors and circuit boards intended to be populated with intermediate connectors. In step 104, a decision is made as to whether the circuit board is to be populated with customer connectors (i.e., connectors accessible from an exterior of an enclosure of the circuit board and adapted to be used for connections external to the enclosure) or intermediate connectors (i.e., connectors accessible from an interior of the enclosure and adapted to be used for connections to interface modules to be substantially contained within the enclosure, wherein the interface modules preferably provide customer connectors).

When a decision is made in step 104 to populate the circuit board with customer connectors, the process continues at step 105. In step 105, the circuit board is populated with customer connectors. In step 106, the circuit board is populated with interface electronics to support the customer connectors. Such interface electronics are preferably installed on a second surface (e.g., underside) of the circuit board opposite a first surface of the circuit board, wherein the first surface is the surface on which intermediate connectors would have been installed had the decision been made to populate the circuit board with intermediate connectors. The first surface is preferably a first planar surface, and the second surface is preferably a second planar surface.

From step 106, the process continues to step 109. In step 109, the circuit board is installed in a customer-connector-compatible enclosure. The customer-connector-compatible enclosure defines at least one aperture to allow access to at least one customer connector from the exterior of the customer-connector-compatible enclosure. Following step 109, the initial zero-option (i.e., options such as modules have not yet been installed) configuration has been completed. From 109, the process continues to step 110. In step 110, the product is used, for example, by connecting equipment external to the customer-connector-compatible enclosure to at least one customer connector.

When a decision is made in step 104 to populate the circuit board with intermediate connectors, the process continues to step 107. In step 107, the circuit board is populated with intermediate connectors. In step 108, the module guides are installed. The module guides aid in alignment of modules as they are inserted and/or removed from the intermediate-connector-compatible enclosure. For example, the module guides may comprise rails, wherein at least one rail preferably engages at least one mating guide, such as at least one mating rail, of at least one module. The module guides preferably extend at least partially adjacent to the first surface of the circuit board. The module guides may also extend at least partially adjacent to at least one other structural component, for example, a substrate structure. The module guides are preferably adapted to position interface modules at a separation distance from the first surface of the circuit board to enhance convective heat transfer. A guide system comprising the module guides and mating guides preferably defines perforations to enhance convective heat transfer. For example, perforations may be provided in module guides, mating guides, and/or both module guides and mating guides to enhance convective heat transfer.

From step 108, the process continues to step 111. In step 111, the circuit board is installed in an intermediate-connector-compatible enclosure. The intermediate-connector-compatible enclosure preferably defines at least one aperture to allow access from the exterior of the intermediate-connector-compatible enclosure to one or more modules that may be installed within the intermediate-connector-compatible enclosure. For example, an aperture may be defined so as to provide access from the exterior of the enclosure to a customer connector of a module for connection of a cable coupled to equipment external to the intermediate-connector-compatible enclosure. The intermediate-connector-compatible enclosure is preferably fitted with electromagnetic compliance features, such as shielding, gaskets for apertures, and/or filtering. Following step 111, the initial zero-option configuration has been completed.

From step 111, the process continues at step 112. In step 112, at least one module is installed in the intermediate-connector-compatible enclosure. At least one mating intermediate connector of the at least one module engages at least one of the intermediate connectors of the circuit board installed in the intermediate-connector-compatible enclosure. The at least one module preferably comprises at least one mating guide to engage at least one module guide.

In step 113, the product is used, for example, by connecting equipment external to the customer-connector-compatible enclosure to at least one customer connector. Optionally, in step 114, at least one module may be uninstalled (i.e., removed) from the intermediate-connector-compatible enclosure, thereby disconnecting the mating intermediate connector of the module from the intermediate connector of the circuit board. Optionally, the process may return to step 112, where at least one other module may be installed in the intermediate-connector-compatible enclosure. Accordingly, modules adapted for use with a circuit board may be pluggable and removable.

Figures 2, 3:
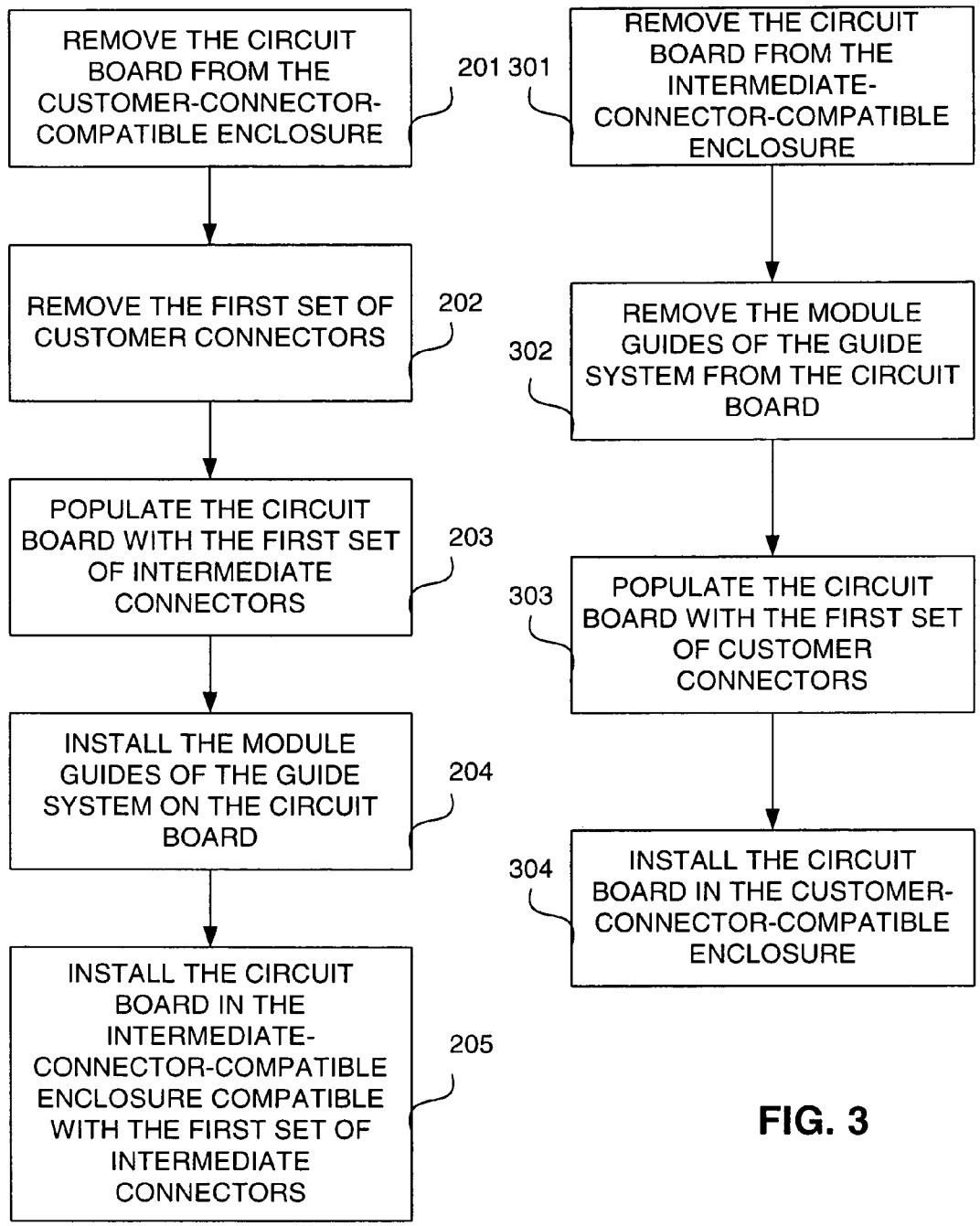
FIG. 2 is a flow diagram illustrating a method in accordance with at least one embodiment of the present invention for when a circuit board has been populated to provide a first set of customer connectors and is to be populated to provide a first set of intermediate connectors.
FIG. 3 is a flow diagram illustrating a method in accordance with at least one embodiment of the present invention for when a circuit board has been populated to provide the first set of intermediate connectors and is to be populated to provide the first set of customer connectors.

FIG. 2 is a flow diagram illustrating a method in accordance with at least one embodiment of the present invention for when a circuit board has been populated to provide a first set of customer connectors and is to be populated to provide a first set of intermediate connectors. In step 201, a circuit board is removed from a customer-connector-compatible enclosure. In step 202, a first set of customer connectors is removed from the circuit board. In step 203, the circuit board is populated with a first set of intermediate connectors. In step 204, module guides of a guide system are installed on the circuit board. In step 205, the circuit board is installed in an intermediate-connector-compatible enclosure. The intermediate-connector-compatible enclosure is compatible with the first set of intermediate connectors. For example, the intermediate-connector-compatible enclosure may define at least one aperture to through which a second set of customer connectors may be accessed from the exterior of the intermediate-connector-compatible enclosure, wherein the second set of customer connectors is provided by at least one module that is connected to at least a portion of the first set of intermediate connectors.

FIG. 3 is a flow diagram illustrating a method in accordance with at least one embodiment of the present invention for when a circuit board has been populated to provide the first set of intermediate connectors and is to be populated to provide the first set of customer connectors. In step 301, a circuit board is removed from an intermediate-connector-compatible enclosure. In step 302, module guides of a guide system are removed from the circuit board. In step 303, the circuit board is populated with a first set of customer connectors. In step 304, the circuit board is installed in a customer-connector-compatible enclosure. The customer-connector-compatible enclosure is compatible with the first set of customer connectors. For example, the customer-connector-compatible enclosure may define at least one aperture to through which the first set of customer connectors may be accessed from the exterior of the customer-connector-compatible enclosure.

Figure 4:
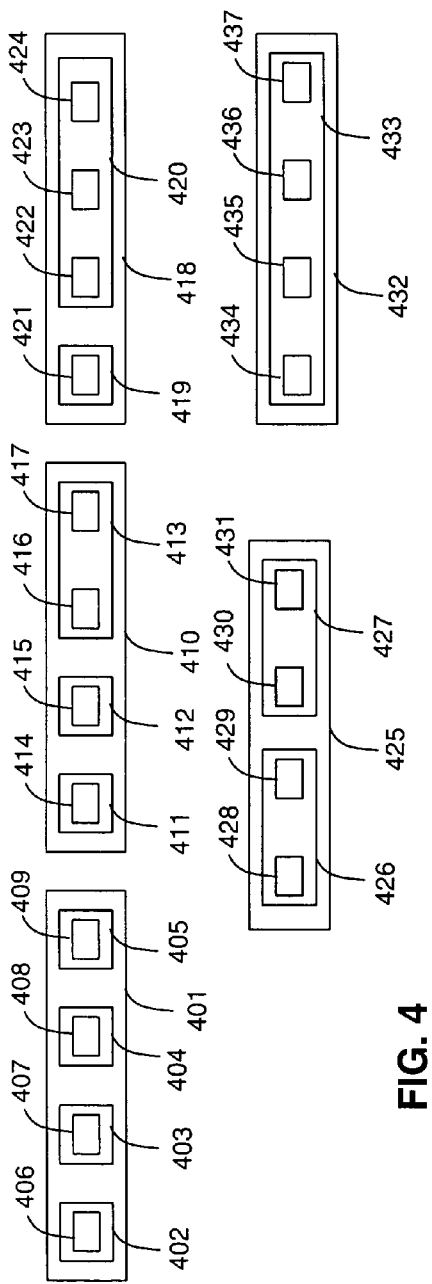
FIG. 4 is a block diagram illustrating several configurations that may be provided in accordance with at least one embodiment of the present invention.

FIG. 4 is a block diagram illustrating several configurations that may be provided in accordance with at least one embodiment of the present invention. A first example of a configuration is depicted by system 401, which comprises several (e.g., four) modules 402, 403, 404, and 405. Each of modules 402, 403, 404, and 405 provides one customer connector, namely customer connectors 406, 407, 408, and 409, respectively. A second example of a configuration is depicted by system 410, which comprises several (e.g., three) modules 411, 412, and 413. Modules 411 and 412 provide one customer connector each, namely customer connectors 414 and 415, and module 413 provides two customer connectors, namely customer connectors 416 and 417.

A third example of a configuration is depicted by system 418, which comprises several (e.g., two) modules 419 and 420. Module 419 provides single customer connector 421, and module 420 provides three customer connectors, namely customer connectors 422, 423, and 424. A fourth example of a configuration is depicted by system 425, which comprises several (e.g., two) modules 426 and 427. Module 426 provides two customer connectors, namely customer connectors 428 and 429, and module 427 provides two customer connectors, namely customer connectors 430 and 431.

A fifth example of a configuration is depicted by system 432, which comprises a module 433. Module 433 provides several (e.g., four) customer connectors, namely customer connectors 434, 435, 436, and 437. As can be seen from the above examples, any combination of any number of modules providing any number of customer connectors may be provided. Also, a system may comprise any number of intermediate connectors to connect to any number of modules.

Figure 5:
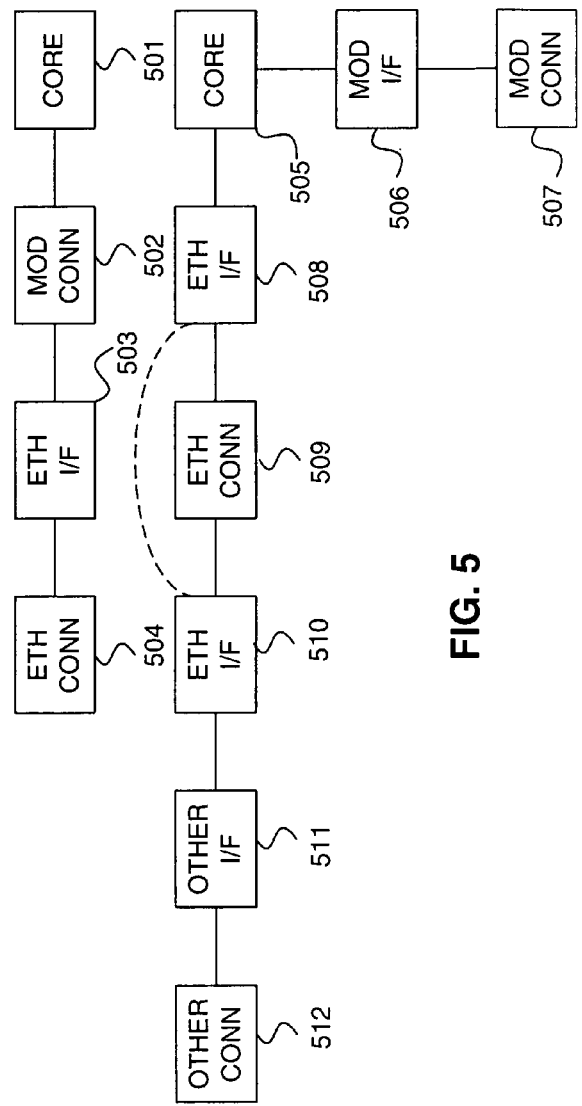
FIG. 5 is a block diagram illustrating several relationships of components in accordance with at least one embodiment of the present invention.

FIG. 5 is a block diagram illustrating several relationships of components in accordance with at least one embodiment of the present invention. A first example is depicted as a system comprising core 501, intermediate connector (e.g., module connector) 502, customer interface (e.g., ethernet interface) 503, and customer connector (e.g., ethernet connector) 504. In accordance with such an example, core 501 provides signals suitable for either customer interface 503 or modules that may be coupled to intermediate connector 502. When a module is connected to intermediate connector 502, customer interface 503 is preferably disabled (or absent from the system), allowing core 501 to communicate via the module connected to intermediate connector 501. Unless the system is desired to remain in an intermediate-connector-compatible configuration to be ready to accept connection to another module, when a module is not connected to the system, customer interface 503 is preferably enabled (or installed and enabled), allowing core 501 to communicate via customer interface 503 and customer connector 504.

An example of a situation when such a configuration may be useful is when customer interface 503 and customer connector 504 are implemented on the circuit board but utilized circuitry similar to circuitry that could otherwise be implemented in a module. In such a situation, customer interface 503 would communicate with core 501 via conductors of the circuit board (e.g., PCB traces), bypassing intermediate connector 502 (without the need for intermediate connector 502 to be installed on the circuit board), but communication between core 501 and customer interface 503 could be implemented using the same signals that would otherwise be used for communication between core 501 and a module connected to intermediate connector 502.

A second example is depicted as core 505, intermediate interface (e.g., module interface) 506, intermediate connector (e.g., module connector) 507, standard customer interface (e.g., ethernet interface) 508, standard customer connector (e.g., ethernet connector) 509, standard customer interface (e.g., ethernet interface) 510, alternate customer interface (e.g., other interface) 511, and alternate customer connector (e.g., other connector) 512. In accordance with such an example, core 505 is coupled to and provides signals for intermediate interface 506 and/or customer interface 508. If present, intermediate interface 506 is coupled to intermediate connector 507, to which pluggable and removable modules may be connected. If present, customer interface 508 is coupled to customer connector 509. Access to customer connector 509 may be provided from the exterior of an enclosure enclosing customer connector 509.

However, if a different type of interface and/or connector is desired, a converter may be provided to convert from the customer connector 509 to an other (e.g., second) customer connector 512. The converter may comprise customer interface 510, other customer interface 511, and other customer connector 512. With such a configuration, customer connector 509 is coupled to customer interface 510, which is coupled to other customer interface 511, which is coupled to other customer connector 512. Other customer interface 511 and other customer connector 512 may provide and allow connection to any type of electrical, optical, or other communication interface. Customer connector 509 may be bypassed (and omitted, if desired) if customer interface 508 is coupled to customer interface 510 via another route, for example, via conductive paths of the circuit board. Customer interface 508, customer connector 509, and customer interface 510 may be bypassed (and omitted, if desired) if core 505 is coupled to other customer interface 511 via another route, for example, via conductive paths of the circuit board.

Figure 6:
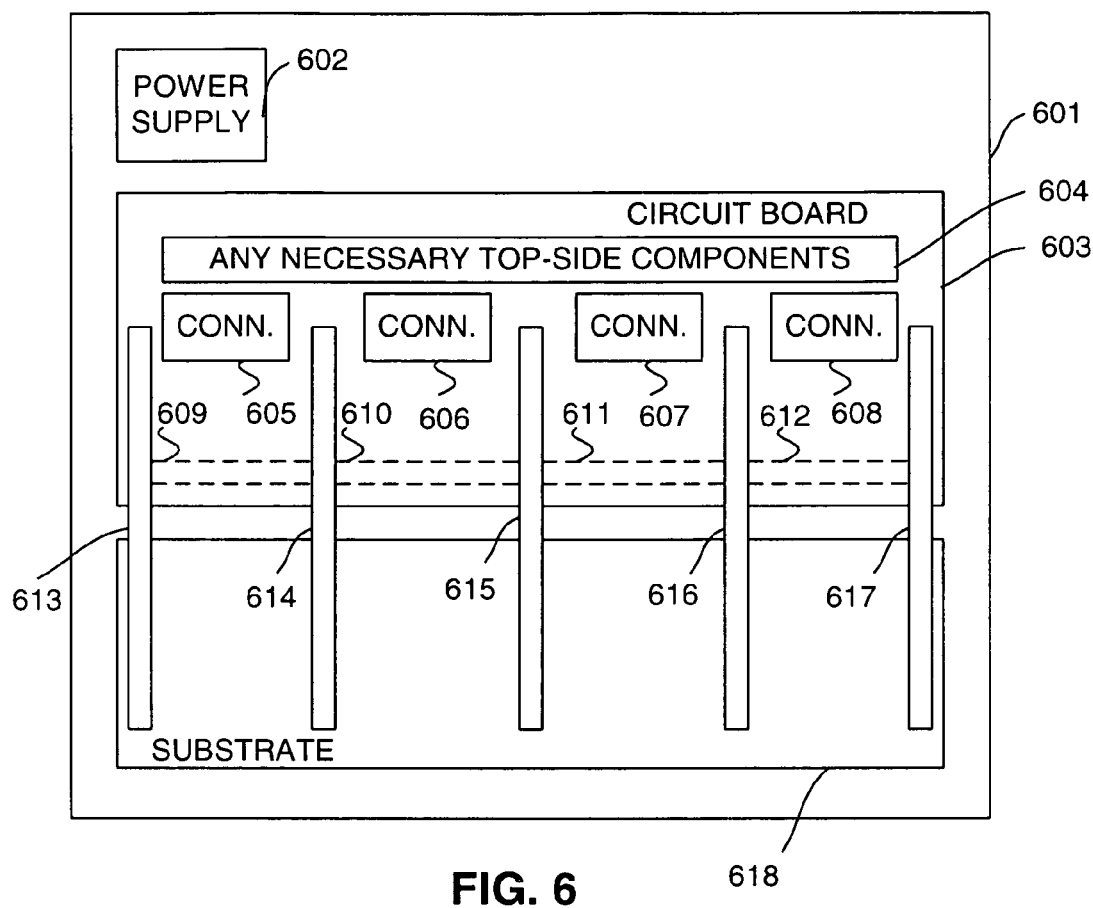
FIG. 6 is a plan view diagram illustrating an example of a system in accordance with at least one embodiment of the present invention.

FIG. 6 is a plan view diagram illustrating an example of a system in accordance with at least one embodiment of the present invention. The system comprises intermediate-connector-compatible enclosure 601; power supply 602; circuit board 603; first surface components 604; intermediate connectors 605, 606, 607, and 608; customer connector solder pads 609, 610, 611, 612; module guides 613, 614, 615, 616, and 617; and substrate structure 618. Enclosure 601 defines apertures 619, 620, 621, and 622 to allow access from the exterior of intermediate-connector-compatible enclosure 601 to modules that may be installed in intermediate-connector-compatible enclosure 601. Alternatively, one or more apertures may be defined over the area over which apertures 619, 620, 621, and 622 are defined. Blank plates may be provided to fill in any of the apertures, for example, to provide a physical and electromagnetic barrier when respective modules are not installed in intermediate-connector-compatible enclosure 601. The apertures may be defined proximate to a first (e.g., front) enclosure end of intermediate-connector-compatible enclosure 601.

Substrate structure 618 is preferably located proximate to the first end of intermediate-connector-compatible enclosure 601. Substrate structure 618 provides a first substrate surface that is preferably coplanar with a first surface of circuit board 603. A first (e.g., front) circuit board end of circuit board 603 is preferably located in proximity to a second substrate end of substrate structure 618 opposite a first substrate end of substrate structure 618, wherein the first substrate end is preferably located in proximity to the first enclosure end of intermediate-connector-compatible enclosure 601. A second (e.g., rear) circuit board end of circuit board 603 opposite the first circuit board end is preferably located in proximity to a first (e.g., front) power supply end of power supply 602. A second (e.g., rear) power supply end of power supply 602 is preferably located opposite the first power supply end and in proximity to a second (e.g., rear) enclosure end of intermediate-connector-compatible enclosure 601, wherein the second enclosure end is preferably located opposite the first enclosure end. By locating power supply 602 beyond the perimeter of circuit board 603, the dimensions of power supply 602 are not constrained by the dimensions of circuit board 603, allowing circuit board 603 to extend over any portion of a space defined between a third (e.g., top) end and a fourth (e.g., bottom) end of intermediate-connector-compatible enclosure 601, as well as over any portion of a space defined between a fifth (e.g., left) and a sixth (e.g., right) end of intermediate-connector-compatible enclosure 601.

Customer connector solder pads 609, 610, 611, and 612 are preferably located proximate to the first circuit board end and distal to the second circuit board end. Intermediate connectors 605, 606, 607, and 608 are preferably located on a side of customer connector solder pads 609, 610, 611, and 612 opposite the first circuit board end and toward the second circuit board end. Intermediate connectors 605, 606, 607, and 608 are preferably located closer to the second circuit board end than the first circuit board end to maximize space for modules that may be coupled to intermediate connectors 605, 606, 607, and 608, but first surface components 604 may be mounted on circuit board 603 between intermediate connectors 605, 606, 607, and 608 and the second circuit board end. First surface components 604 are preferably mounted on circuit board 603 proximate to the second circuit board end and distal to the first circuit board end. By mounting first surface components 604 on a first (e.g., top) surface of circuit board 603, first surface components 604 may be approximately as tall as any modules that may be connected to intermediate connectors 605, 606, 607, and 608, as the distance between the first surface of circuit board 603 and a third (e.g., top) end of intermediate-connector-compatible enclosure 601 may be approximately similar for areas of the first surface of circuit board 603 over which intermediate connectors 605, 606, 607, and 608 and first surface components 604 may be mounted. Accordingly, depending on the distance between the second (e.g., bottom) surface of circuit board 603 and a fourth (e.g., bottom) end of intermediate-connector-compatible enclosure 601, the height of components (e.g., first surface components 604) that may be mounted on the first surface of circuit board 603 may be greater than the height of components that may be mounted on the second surface of circuit board 603. However, components may be mounted on the second surface of circuit board 603, even over an area between the first circuit board end and intermediate connectors 605, 606, 607, and 608, while the area between the first circuit board end and intermediate connectors 605, 606, 607, and 608 is preferably kept clear of any components having a height sufficient to interfere with any modules that may be installed in proximity to such an area. By not installing customer connectors on customer connector solder pads 609, 610, 611, and 612, interference with any modules that may be installed may be further avoided or minimized.

Module guides 613, 614, 615, 616, and 617 are preferably installed so as to extend from a first substrate surface of substrate structure 618 proximate to the first substrate end of the substrate structure 618 to the first surface of circuit board 603 proximate to intermediate connectors 605, 606, 607, and 608. Module guides 613, 614, 615, 616, and 617 help define paths through which modules may be inserted to connect to intermediate connectors 605, 606, 607, and 608. For example, module guides 613 and 614 help define a path from aperture 619, over substrate structure 618, over customer connector solder pads 609 and a portion of the first surface of circuit board 603, to intermediate connector 605. As another example, module guides 614 and 615 help define a path from aperture 620, over substrate structure 618, over customer connector solder pads 610 and a portion of the first surface of circuit board 603, to intermediate connector 606. As yet another example, module guides 615 and 616 help define a path from aperture 621, over substrate structure 618, over customer connector solder pads 611 and a portion of the first surface of circuit board 603, to intermediate connector 607. As one more example, module guides 616 and 617 help define a path from aperture 622, over substrate structure 618, over customer connector solder pads 612 and a portion of the first surface of circuit board 603, to intermediate connector 608. The paths defined by module guides 613, 614, 615, 616, and 617 have axes parallel to the module guides defining those paths.

Figure 7:
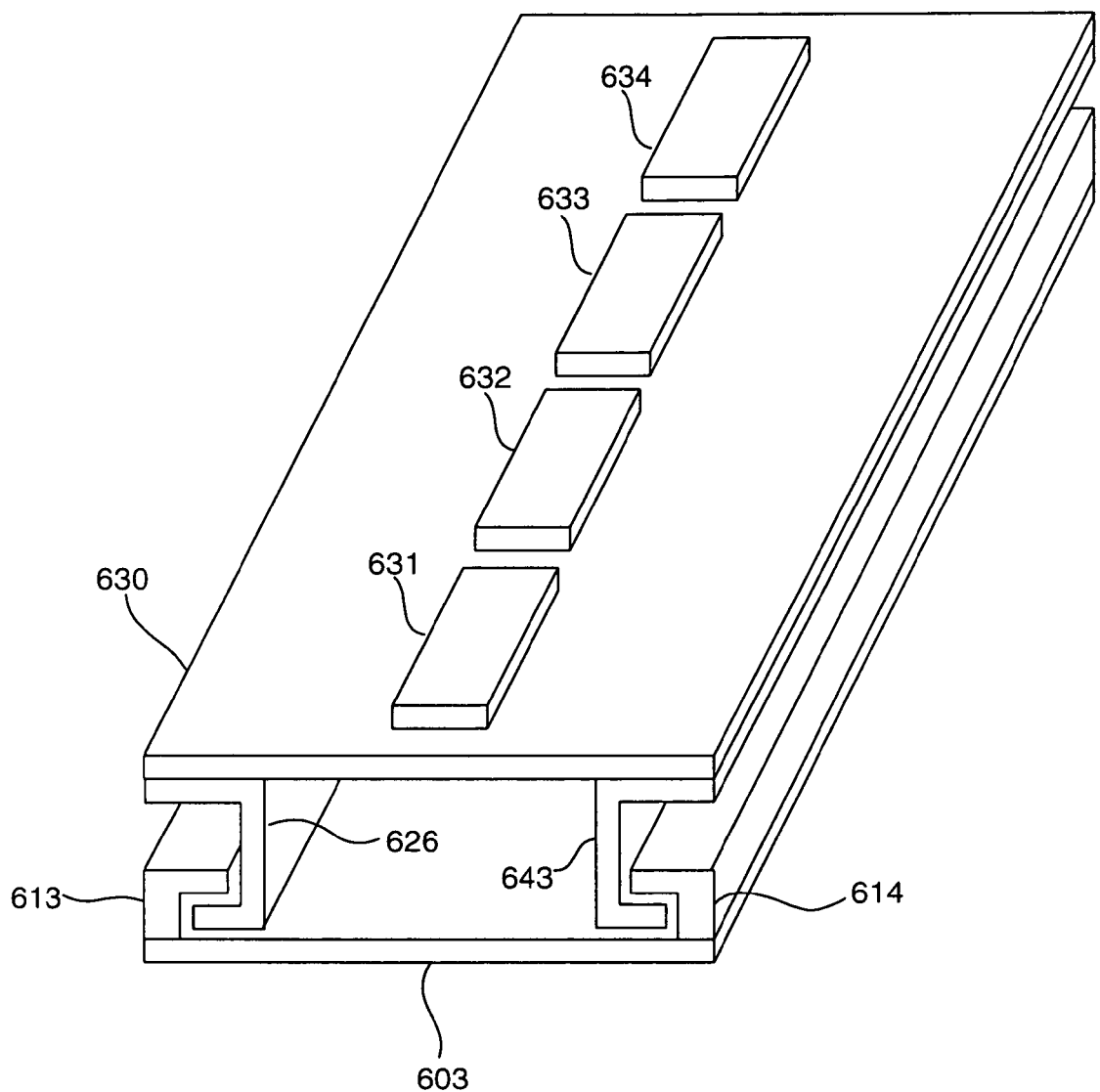
FIG. 7 is a prospective view diagram illustrating an example of a system in accordance with at least one embodiment of the present invention.

FIG. 7 is a prospective view diagram illustrating an example of a system in accordance with at least one embodiment of the present invention. Module guides 613 and 614 are attached to substrate structure 618 and/or circuit board 603. Module guides 613 and 614 preferably provide linear rails that are parallel to one another and that are adapted to engage, preferably slidably, mating guides 626 and 643. Mating guides 626 and 643 are attached to module circuit board 630. Mating guides 626 and 643 preferably provide linear rails that are parallel to one another and that adapted to engage, preferably slidably, module guides 613 and 614. Module first surface components 631, 632, 633, and 634 are mounted on a module first surface of module circuit board 630. Accordingly, the system accommodates installation and removal of a module comprising module circuit board 630, mating guides 626 and 643, and module first surface components 631, 632, 633, and 634.

Figure 8:
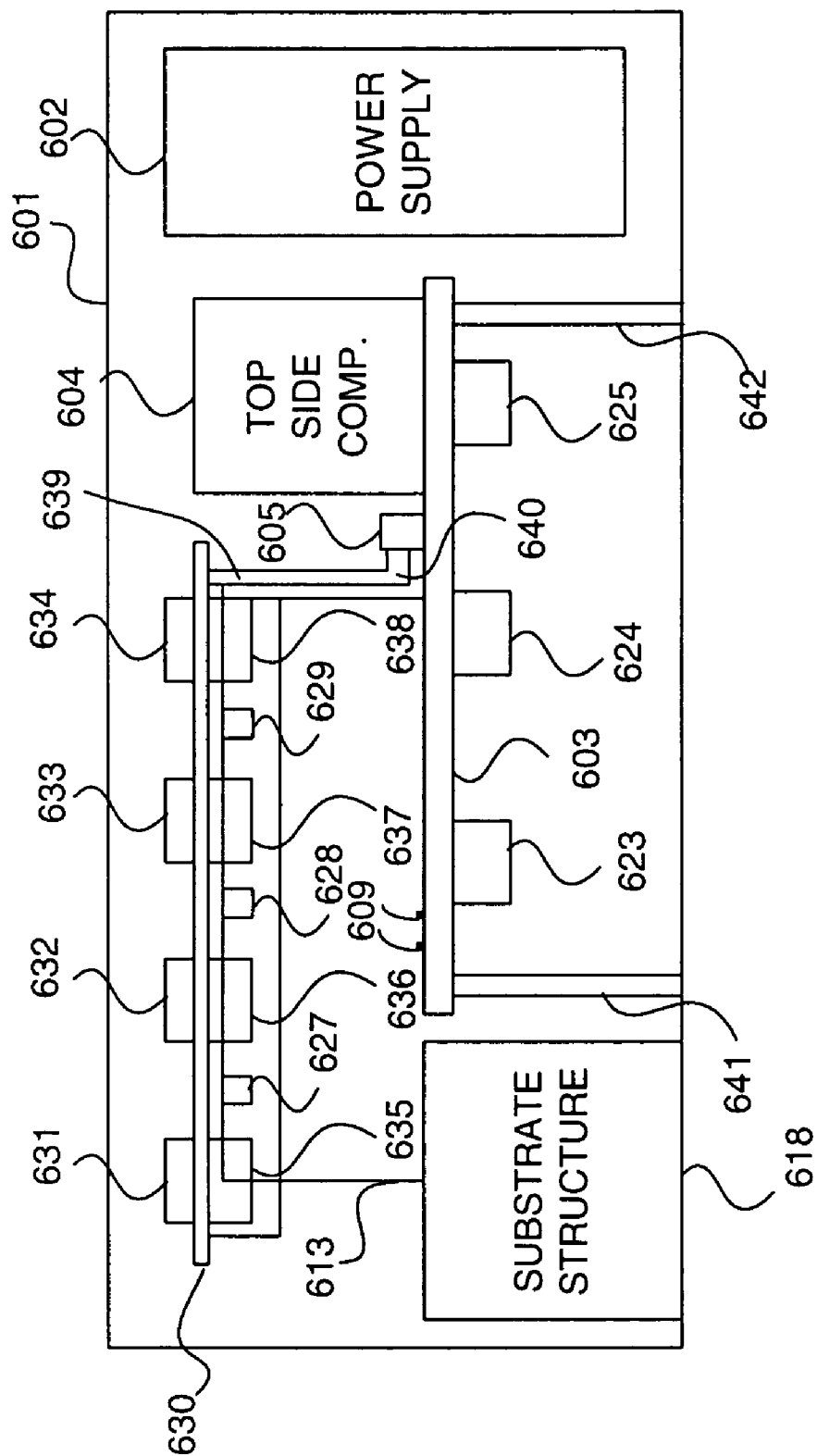
FIG. 8 is an elevation view diagram illustrating an example of a system in accordance with at least one embodiment of the present invention.

FIG. 8 is an elevation view diagram illustrating an example of a system in accordance with at least one embodiment of the present invention. The system comprises intermediate-connector-compatible enclosure 601, power supply 602, circuit board 603, first (e.g., top) surface component 604, intermediate connector 605, second (e.g., bottom) surface components 623, 624, and 625, customer connector solder pads 609, module guide 613, mating guide 626, substrate structure 618, module circuit board 630, module first (e.g., top) surface components 631, 632, 633, and 634, module second (e.g., bottom) surface components 635, 636, 637, and 638, module interconnect 639, mating intermediate connector 640, and standoffs 641 and 642. The guide system comprising module guide 613 and mating guide 626 defines perforations 627, 628, and 629 to enhance convective heat transfer. Standoffs 641 and 642 position circuit board 603 a standoff distance away from the interior of the second end of intermediate-connector-compatible enclosure 601 to allow space to accommodate the height of second surface components 623, 624, and 625 and to promote convective heat transfer.

As illustrated, since power supply 602 is preferably located between the second end of circuit board 603 and the second end of intermediate-connector-compatible enclosure 601, power supply 602 may occupy the entire space between those ends from interior of the third end of intermediate-connector-compatible enclosure 601 to the interior of the four end of intermediate-connector-compatible enclosure 601 or any portion thereof. First surface component 604 is preferably mounted on a first surface of circuit board 603 and may occupy a space between intermediate connector 605 and the second end of circuit board 603 having a height no greater than a distance from the first surface of circuit board 603 to the interior of the third end of intermediate-connector-compatible enclosure 601 or any portion thereof.

Second surface components 623, 624, and 625 are preferably mounted on the second surface of circuit board 603 and may occupy a space over the second surface of circuit board 603 (excluding any space occupied by standoffs 641 and 642) between the second surface of circuit board 603 and the interior of the fourth end of intermediate-connector-compatible enclosure 601. Locating second surface components 623, 624, and 625 on the second surface of circuit board 603 can help reduce the need for components to be mounted on the first surface of circuit board 603, maximizing a flat (and preferably bare) area of the first surface of circuit board 603 over which module guide 613 and mating guide 626 may be positioned. Mating guide 626 engages, preferably slidably, module guide 613. Mating guide 626 is coupled to module circuit board 630. Module first surface components 631, 632, 633, and 634 are mounted on a module first (e.g., top) surface of module circuit board 630. Module second surface components 635, 636, 637, and 638 are mounted on a module second (e.g., bottom) surface of module circuit board 630.

Module guide 613 and mating guide 626 position module circuit board 630 at a separation distance from substrate structure 618 and circuit board 603 so as to enhance convective heat transfer. Either module guide 613 or mating guide 626 may define perforations 627, 628, and 629, or both module guide 613 and mating guide 626 may define perforations to enhance convective heat transfer. Given the separation distance provided by the guide system, module second surface components 635, 636, 637, and 638 may occupy a space over the module second surface of module circuit board 630 between the module second surface of module circuit board 630 and the first surface of circuit board 603 and/or the surface of substrate structure 618, as the first surface of circuit board 603 and the surface of substrate structure 618 preferably lie in the same plane. Substrate structure 618 may be attached so as to maintain a coplanar relationship with circuit board 603, for example by attaching substrate structure 618 to standoffs 641 and 642, either directly or through an intermediate mechanical structure, such as intermediate-connector compatible enclosure, which may be coupled to substrate structure 618 and circuit board 603. Module first surface components 631, 632, 633, and 634 may occupy a space over the module first surface of module circuit board 630 between the module first surface of module circuit board 630 and the interior of the first end of intermediate-connector-compatible enclosure 601.

To accommodate the separation distance provided by the guide system, a module interconnect 639 coupled to a mating intermediate connector 640, which mates with intermediate connector 605, may be provided to couple conductors of module circuit board 630 to mating intermediate connector 640 and to span the distance from module circuit board 630 to intermediate connector 605. Module interconnect 639 is preferably coupled to the module second surface of module circuit board 630.

Figure 9:
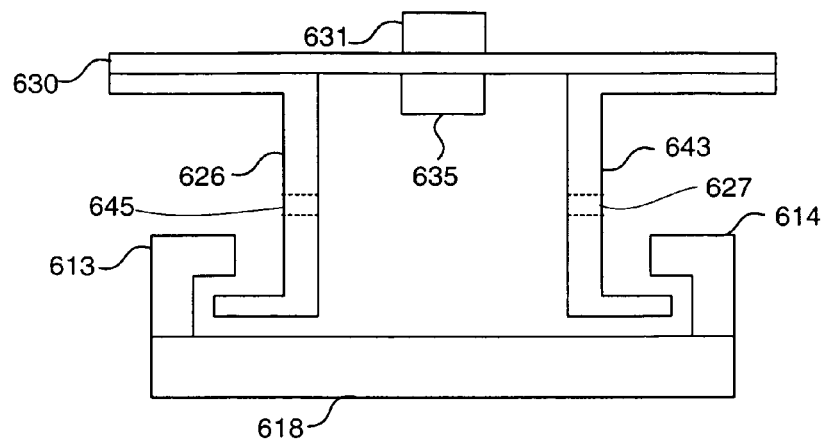
FIG. 9 is a cross-sectional diagram illustrating an example of a module guide subsystem in accordance with at least one embodiment of the present invention.

FIG. 9 is a cross-sectional diagram illustrating an example of a module guide subsystem in accordance with at least one embodiment of the present invention. Module guides 613 and 614 are mounted on substrate structure 618 (and/or circuit board 603), preferably along axes parallel to one another. Mating guides 626 and 643 are mounted on module circuit board 630, preferably along axes parallel to one another, and preferably on the module second surface of the module circuit board 630. Mating guide 626 engages, preferably slidably, module guide 613. Mating guide 643 engages, preferably slidably, module guide 614. Module first surface components, such as module first surface component 631, may be mounted on the module first surface of module circuit board 630. Module second surface components, such as module second surface component 635, may be mounted on the module second surface of the module circuit board 630. The guide system comprising module guides 613 and 614 and mating guides 626 and 643 maintain module circuit board 630 at a separation distance from substrate structure 618, wherein the separation distance preferably provides a sufficient air duct to enhance convective heat transfer to remove heat from components of the system that dissipate heat.

Figure 10:
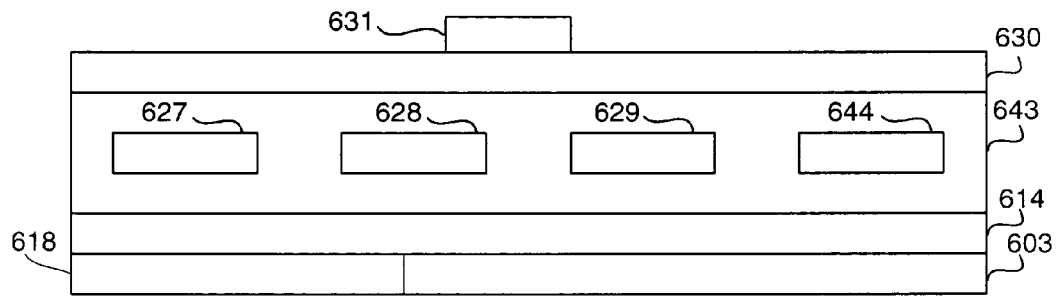
FIG. 10 is an elevation view diagram illustrating an example of a module guide subsystem in accordance with at least one embodiment of the present invention.

FIG. 10 is an elevation view diagram illustrating an example of a module guide subsystem in accordance with at least one embodiment of the present invention. Module guide 614 is mounted on substrate structure and/or circuit board 603, which are preferably coplanar. For example, module guide 614 may provide a linear rail to slidably engage mating guide 626. A module comprises module circuit board 630, mating guide 626, and module first surface component 631. Mating guide 626 is mounted on module circuit board 630. Module first surface component 631 is mounted on the first surface of module circuit board 630. Preferably, mating guide 626 and/or module guide 614 define perforations 627, 628, 629, and 644, which allow ventilation across the guide system, thereby enhancing convective heat transfer. As illustrated, perforations 627, 628, 629, and 644 may be implemented as elongated perforations, such as elongated rectangular perforations. Alternatively, perforations 627, 628, 629, and 644 may be implemented as a series of non-elongated perforations, for example, round or square perforations.

Figure 11:
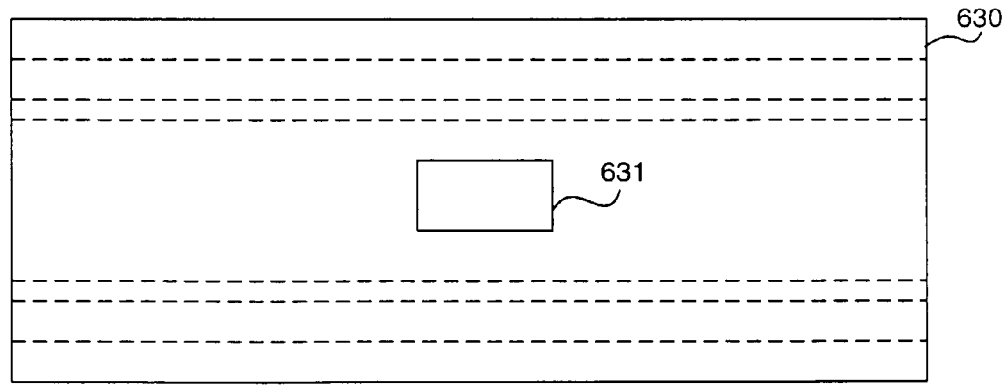
FIG. 11 is a plan view diagram illustrating an example of a module guide subsystem in accordance with at least one embodiment of the present invention.

FIG. 11 is a plan view diagram illustrating an example of a module guide subsystem in accordance with at least one embodiment of the present invention. From such a view, module circuit board 630 and module first surface component 631 are visible, and features of the guide subsystem are denoted by dashed lines. The module comprises module circuit board 630 and module first surface component 631 mounted on the module first surface of the module circuit board 630.

Figure 12:
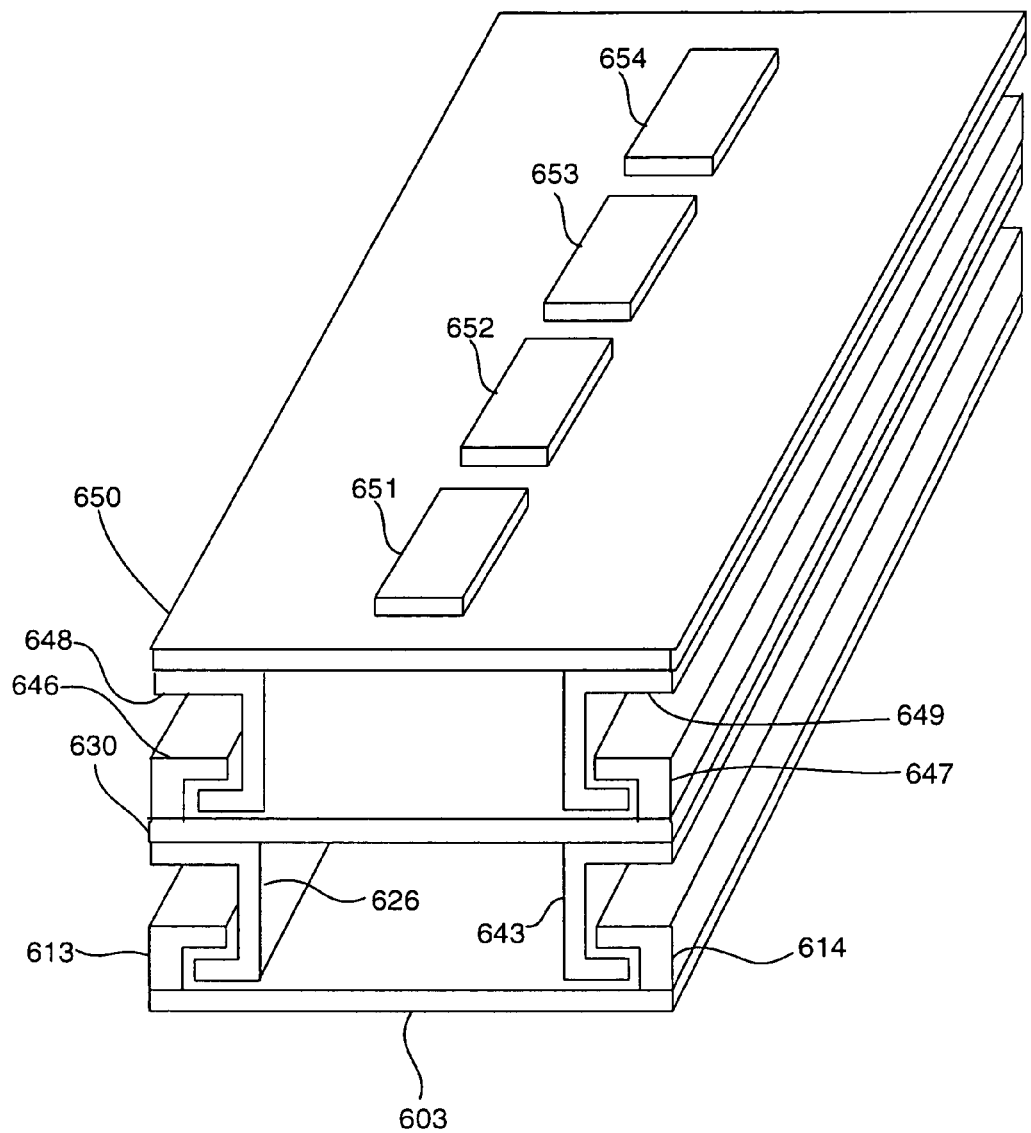
FIG. 12 is a prospective view diagram illustrating an example of a system incorporating a stackable module guide subsystem in accordance with at least one embodiment of the present invention.

FIG. 12 is a prospective view diagram illustrating an example of a system incorporating a stackable module guide subsystem in accordance with at least one embodiment of the present invention. Module guides 613 and 614 are attached to a first surface of circuit board 603 (and optionally may be continued over a substrate structure 618). Mating guides 626 and 643 are attached to a first module second surface of a first module, preferably first module circuit board 630. Mating guides 626 and 643 are adapted to engage module guides 613 and 614, respectively.

Module guides 646 and 647 are attached to a first module first surface of the first module, preferably first module circuit board 630. Mating guides 648 and 649 are attached to a second module second surface of a second module, preferably second module circuit board 650. Mating guides 648 and 649 are adapted to engage module guides 646 and 647, respectively. Second module first surface components 651, 652, 653, and 654 are mounted on a second module first surface of second module circuit board 650.

Several intermediate connectors at several distances from circuit board 603 may be provided to engage and couple signals to and from the first and second modules and/or an additional intermediate connector may be provided on the first module to couple the second module (e.g., in a daisy-chained manner). Perforations to enhance convective heat transfer are preferably provided for both the first guide subsystem comprising module guides 613 and 614 and mating guides 626 and 643 and the second guide subsystem comprising module guides 646 and 647 and mating guides 648 and 649.

Figure 13:
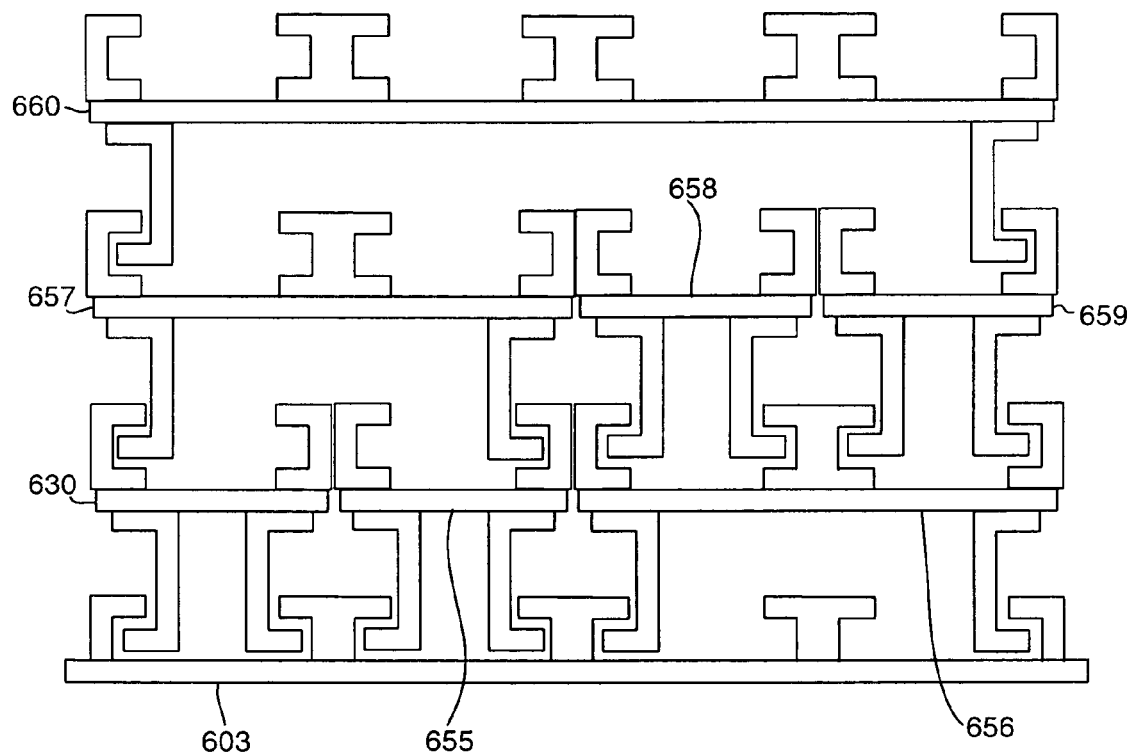
FIG. 13 is an elevation view diagram illustrating an example of a system incorporating a stackable module guide subsystem in accordance with at least one embodiment of the present invention.

FIG. 13 is an elevation view diagram illustrating an example of a system incorporating a stackable module guide subsystem in accordance with at least one embodiment of the present invention. Several modules may be installed at one or more levels with respect to circuit board 603. Module guides of circuit board 603 are adapted to couple with mating guides of one or more modules at a first level, such as modules illustrated with reference to module circuit boards 630, 655, and 656. One or more modules at a second level with respect to circuit board 603, such as modules illustrated with reference to module circuit boards 657, 658, and 659, may be installed such that their mating guides engage one or more module guides of one or more modules installed at the first level. One or more modules at a third level with respect to circuit board 603, such as the module illustrated with reference to module circuit board 660, may be installed such that their mating guides engage one or more module guides of one or more modules installed at the second level.

As can be seen from the illustrated example, various combinations of modules of various sizes may be installed. For example, the illustrated example depicts two one-port modules and one two-port module installed at the first level, a two-port module and two one-port modules installed at the second level, and one four-port module installed at the third level. As illustrated, various numbers of modules of various numbers of ports may be installed at one or more of several levels without the type of modules on any one level imposing constraints as to the type of modules and their configuration on any other level. However, for any given level, a sufficient number of modules should preferably be installed at the preceding level to provide sufficient mechanical stability.

As shown in the illustrated example, module guides and mating guides of a guide subsystem in accordance with at least one embodiment of the present invention may have cross sections in a variety of designs, for example, those that approximate the shapes of the letters C or U, I or H, T, L or J, F, E, V, M, K, N or Z, etc., wherein at least a portion of a module guide engages at least a portion of a mating guide to define a mechanical relationship between a circuit board and a module or between a module of one level and a module of a succeeding level.

As shown in FIG. 13, a system in accordance with at least one embodiment may comprise a chassis and a first module. The chassis may comprise a first module guide. The first module may comprise a first mating guide. The first mating guide may be adapted to slidably engage the first module guide. However, the first mating guide may be unable to engage a second module. The inability to engage the second module may be provided by limiting the first mating guide to providing a mechanical interface between the first module and the chassis and not configuring it to provide a mechanical interface between a second module and the chassis.

When the chassis comprises a second module guide not engaged by the first mating guide but spanned by the first module, the first module and the second module guide preferably define a clearance to allow movement of the first module relative to the second module guide without interference. By spanning the second module guide, the first module extends to and engages module guides on both sides of the second module guide, but does not engage the second module guide. The first module need not engage module guides immediately adjacent to the second module guide, but may span multiple module guides. Spanned module guides may also be referred to as unused module guides.

In accordance with at least one embodiment, the first mating guide is mounted on a first surface (e.g., a surface closer to the first module guide) of the first module. The first module preferably further comprises a second module guide mounted on a second surface (e.g., a surface farther from the first module guide) of the first module. The second surface is preferably opposite the first surface. The second module guide is preferably adapted to engage a second mating guide of a second module.

In accordance with at least one embodiment, the first mating guide is mounted on a first surface of the first module parallel to a first edge of the first surface so as to define an unpopulated area of the first surface between the first mating guide and the first edge. The unpopulated area is an area where the first surface extends but is not covered by the first mating guide or other objects, for example, electronic components. The unpopulated area exposes the first edge of the first surface (e.g., a card edge of a circuit board of the first module) allowing engagement of the first edge with a card edge module guide without interference with the first mating guide. Such interference would result if the first mating guide were positioned so as to block engagement of the first edge with the card edge module guide.

In accordance with at least one embodiment, the first module comprises a first circuit board, wherein first mating guide engages the first module guide at an angle that is not perpendicular to a plane of the first circuit board and at a location that is offset from the plane of the first circuit board. Although the actual engagement of the first mating guide with the first module guide may involve several segments at several angles, the angle referred to above should be understood to be an axis of a significant terminal portion of the first mating guide and/or the first module guide. A location that is offset from the plane should be understood to be a location that lies outside of the plane of the first circuit board. In accordance with at least one embodiment, the first module guide has a T-shaped cross section.

In accordance with at least one embodiment, a chassis comprises a first module guide. The first module guide is preferably adapted to slidably engage a first mating guide of a first module. The first mating guide preferably does not extend through a plane of a circuit board of the first module outside a perimeter of the circuit board.

Preferably, the chassis comprises a second module guide adapted to be spanned by the first module, wherein the second module guide defines a clearance to allow movement of the first module relative to the second module guide without the first module contacting the second module guide. The clearance may be defined between the second module guide and the portion of the first module that extends closest to the second module guide, for example, an electronic component mounted on a surface of a circuit board of the first module.

Preferably, the chassis comprises a plurality of module guides comprising the first module guide, wherein the plurality of module guides are adaptable to slidably engage a plurality of modules. Preferably, a first portion of the plurality of modules has a first module width and a second portion of the plurality of modules has a second module width, the first module width being different than the second module width. For example, the first module width may be a single unit width wherein the first module engages adjacently disposed module guides, while the second module width may be a two unit width wherein the second module spans an unused module guide and engages module guides adjacent to and on both sides of the unused module guide. Preferably, the first module of the first module width may be removed and replaced by a second module of the second module width without removal of any of the module guides.

Preferably, the chassis is adapted to engage a card edge module guide, the card edge module guide extending into the plane of the circuit board and beyond both sides of the plane of the circuit board and adapted to engage a first edge of the circuit board. Preferably, the first module guide is adapted to engage the first mating guide at an angle that is not perpendicular to a plane of the first circuit board and at a location that is offset from the plane of the first circuit board. Preferably, the first module guide has a T-shaped cross section.

In accordance with at least one embodiment, a first module comprises a first mating guide adapted to slidably engage a first module guide of a chassis but is unable to engage a second module. Preferably, the first mating guide does not extend through a plane of a circuit board of the first module outside a perimeter of the circuit board. Preferably, the first module is adapted to span a second module guide of a chassis, wherein the second module guide not engaged by the first mating guide and the first module defines a clearance to allow movement of the first module relative to the second module guide without the first module contacting the second module guide.

Preferably, the first mating guide is mounted on a first surface of the first module. Preferably, the first module further comprises a second module guide mounted on a second surface of the first module, wherein the second surface is opposite the first surface. Preferably, the second module guide is adapted to engage a second mating guide of a second module.

Preferably, the first mating guide is mounted on a first surface of the first module parallel to a first edge of the first surface so as to define an unpopulated area of the first surface between the first mating guide and the first edge, allowing engagement of the first edge with a card edge module guide without interference with the first mating guide. Preferably, the first module comprises a first circuit board, wherein first mating guide is adapted to engage the first module guide at an angle that is not perpendicular to a plane of the first circuit board and at a location that is offset from the plane of the first circuit board.

In accordance with at least one embodiment, a first module guide is adapted to be mountable on a first chassis surface of a chassis structure and adaptable to engage a first mating guide mounted on a first module surface of a module. Preferably, the first module guide defines a gap between the first module guide and the first module surface.

Preferably, the first module guide has a first module guide cross section comprising a first module guide cross section portion extending in first direction away from the first chassis surface and a second module guide cross section portion coupled to the first cross section portion distal to the first chassis surface, the second module guide cross section portion extending in a second direction at a first module guide angle to the first direction. Preferably, the first module guide cross section is a T-shaped cross section. Preferably, the first mating guide has a first mating guide cross section comprising a first mating guide cross section portion extending in a third direction opposite the first direction and a second mating guide cross section portion coupled to the first mating guide cross section portion distal to the first module surface, the second mating guide cross section portion extending in a fourth direction at a mating guide angle to the third direction. Preferably, the fourth direction opposes the second direction.

Thus, a method and apparatus for a fixed and replaceable module architecture data path interface has been presented. Although the invention has been described using certain specific examples, it will be apparent to those skilled in the art that the invention is not limited to these few examples. For example, although the invention has been described with respect to particular examples of connectors, module guides, etc., the invention may be used in systems with other types of such features that may have other characteristics, for example, other types of connector and/or other designs of module guides. Other embodiments utilizing the inventive features of the invention will be apparent to those skilled in the art, and are encompassed herein.

What is claimed is:

1. Apparatus comprising:
a chassis comprising a first module guide; and a first module comprising a first mating guide, the first mating guide adapted to slidably engage the first module guide but unable to engage a second module, wherein the first mating guide is mounted on a first surface of the first module and wherein the first module further comprises a second module guide mounted on a second surface of the first module, wherein the second surface is opposite the first surface, the second module guide adapted to engage a second mating guide of a second module.

2. The apparatus of claim 1 wherein, when the chassis comprises a second module guide not engaged by the first mating guide but spanned by the first module, the first module and the second module guide define a clearance to allow movement of the first module relative to the second module guide without interference.

3. The apparatus of claim 1 wherein the first mating guide is mounted on a first surface of the first module parallel to a first edge of the first surface so as to define an unpopulated area of the first surface between the first mating guide and the first edge, allowing engagement of the first edge with a card edge module guide without interference with the first mating guide.

4. The apparatus of claim 1 wherein the first module comprises a first circuit board, wherein first mating guide engages the first module guide at an angle that is not perpendicular to a plane of the first circuit board and at a location that is offset from the plane of the first circuit board.

5. The apparatus of claim 1 wherein the first module guide has a T-shaped cross section.

6. Apparatus comprising:
a chassis comprising a first module guide, the first module guide adapted to slidably engage a first mating guide of a first module, the first mating guide not extending through a plane of a circuit board of the first module outside a perimeter of the circuit board, wherein the chassis comprises a plurality of module guides comprising the first module guide, wherein the plurality of module guides are adaptable to slidably engage a plurality of modules, wherein a first portion of the plurality of modules has a first module width and a second portion of the plurality of modules has a second module width, the first module width being different than the second module width.

7. The apparatus of claim 6 wherein the chassis comprises a second module guide adapted to be spanned by the first module, wherein the second module guide defines a clearance to allow movement of the first module relative to the second module guide without the first module contacting the second module guide.

8. The apparatus of claim 6 wherein the first module of the first module width may be removed and replaced by a second module of the second module width without removal of any of the module guides.

9. The apparatus of claim 6 wherein the chassis is adapted to engage a card edge module guide, the card edge module guide extending into the plane of the circuit board and beyond both sides of the plane of the circuit board and adapted to engage a first edge of the circuit board.

10. The apparatus of claim 6 wherein the first module guide is adapted to engage the first mating guide at an angle that is not perpendicular to a plane of the first circuit board and at a location that is offset from the plane of the first circuit board.

11. The apparatus of claim 6 wherein the first module guide has a T-shaped cross section.

12. Apparatus comprising:
a first module comprising a first mating guide adapted to slidably engage a first module guide of a chassis but unable to engage a second module, wherein the first mating guide is mounted on a first surface of the first module parallel to a first edge of the first surface so as to define an unpopulated area of the first surface between the first mating guide and the first edge, allowing engagement of the first edge with a card edge module guide without interference with the first mating guide.

13. The apparatus of claim 12 wherein the first mating guide does not extend through a plane of a circuit board of the first module outside a perimeter of the circuit board.

14. The apparatus of claim 12 wherein the first module is adapted to span a second module guide of a chassis, wherein the second module guide not engaged by the first mating guide and the first module defines a clearance to allow movement of the first module relative to the second module guide without the first module contacting the second module guide.

15. The apparatus of the claim 12 wherein the first mating guide is mounted on a first surface of the first module and wherein the first module further comprises a second module guide mounted on a second surface of the first module, wherein the second surface is opposite the first surface, the second module guide adapted to engage a second mating guide of a second module.

16. The apparatus of claim 12 wherein the first module comprises a first circuit board, wherein first mating guide is adapted to engage the first module guide at an angle that is not perpendicular to a plane of the first circuit board and at a location that is offset from the plane of the first circuit board.

17. Apparatus comprising:
a first module guide adapted to be mountable on a first chassis surface of a chassis structure and adaptable to engage a first mating guide mounted on a first module surface of a module, wherein the first module guide defines a gap between the first module guide and the first module surface, wherein the first module guide has a first module guide cross section comprising;
a first module guide cross section portion extending in a first direction away from the first chassis surface; and a second module guide cross section portion coupled to the first cross section portion distal to the first chassis surface, the second module guide cross section portion extending in a second direction at a first module guide angle to the first direction.

18. The apparatus of claim 17 wherein the first module guide cross section is a T-shaped cross section 19. The apparatus of claim 17 wherein the first mating guide has a first mating guide cross section comprising:

a first mating guide cross section portion extending in a third direction opposite the first direction; and a second mating guide cross section portion coupled to the first mating guide cross section portion distal to the first module surface, the second mating guide cross section portion extending in a fourth direction at a mating guide angle to the third direction.

20. The apparatus of claim 19 wherein the fourth direction opposes the second direction.

* * * * *